United States Patent
Zhu et al.

(10) Patent No.: US 7,852,660 B2
(45) Date of Patent: Dec. 14, 2010

(54) ENHANCING READ AND WRITE SENSE MARGINS IN A RESISTIVE SENSE ELEMENT

(75) Inventors: Wenzhong Zhu, Apple Valley, MN (US); Hai Li, Eden Prairie, MN (US); Yiran Chen, Eden Prairie, MN (US); Xiaobin Wang, Chanhassen, MN (US); Henry Huang, Apple Valley, MN (US); Haiwen Xi, Prior Lake, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 102 days.

(21) Appl. No.: 12/425,856

(22) Filed: Apr. 17, 2009

(65) Prior Publication Data

US 2010/0085796 A1  Apr. 8, 2010

Related U.S. Application Data

(60) Provisional application No. 61/103,734, filed on Oct. 8, 2008.

(51) Int. Cl.
*G11C 11/00* (2006.01)
*G11C 11/14* (2006.01)
*G11C 17/00* (2006.01)

(52) U.S. Cl. .................. 365/148; 365/100; 365/158; 365/171

(58) Field of Classification Search ................. 365/148
See application file for complete search history.

(56) References Cited

U.S. PATENT DOCUMENTS

| 6,005,800 A | 12/1999 | Koch et al. |
| 7,068,531 B2 | 6/2006 | Katti |
| 7,764,537 B2 * | 7/2010 | Jung et al. .................. 365/158 |
| 2008/0061388 A1 | 3/2008 | Diao et al. |
| 2010/0034009 A1 * | 2/2010 | Lu et al. .................... 365/148 |

OTHER PUBLICATIONS

J. C. Slonczewski, "Currents, torques, and polarization factors in magnetic tunnel junctions," Physical Review B 71, 2005, pp. 1-10, The American Physical Society, US.
J. Z. Sun, "Spin-current interaction with a monodomain magnetic body: A model study," Physical Review B, 2000, pp. 570-578, vol. 62, No. 1, The American Physical Society, US.

* cited by examiner

*Primary Examiner*—Son L Mai
(74) *Attorney, Agent, or Firm*—Fellers, Snider, et al.

(57) ABSTRACT

An apparatus and method for enhancing read and write sense margin in a memory cell having a resistive sense element (RSE), such as but not limited to a resistive random access memory (RRAM) element or a spin-torque transfer random access memory (STRAM) element. The RSE has a hard programming direction and an easy programming direction. A write current is applied in either the hard programming direction or the easy programming direction to set the RSE to a selected programmed state. A read circuit subsequently passes a read sense current through the cell in the hard programming direction to sense the selected programmed state of the cell.

20 Claims, 7 Drawing Sheets

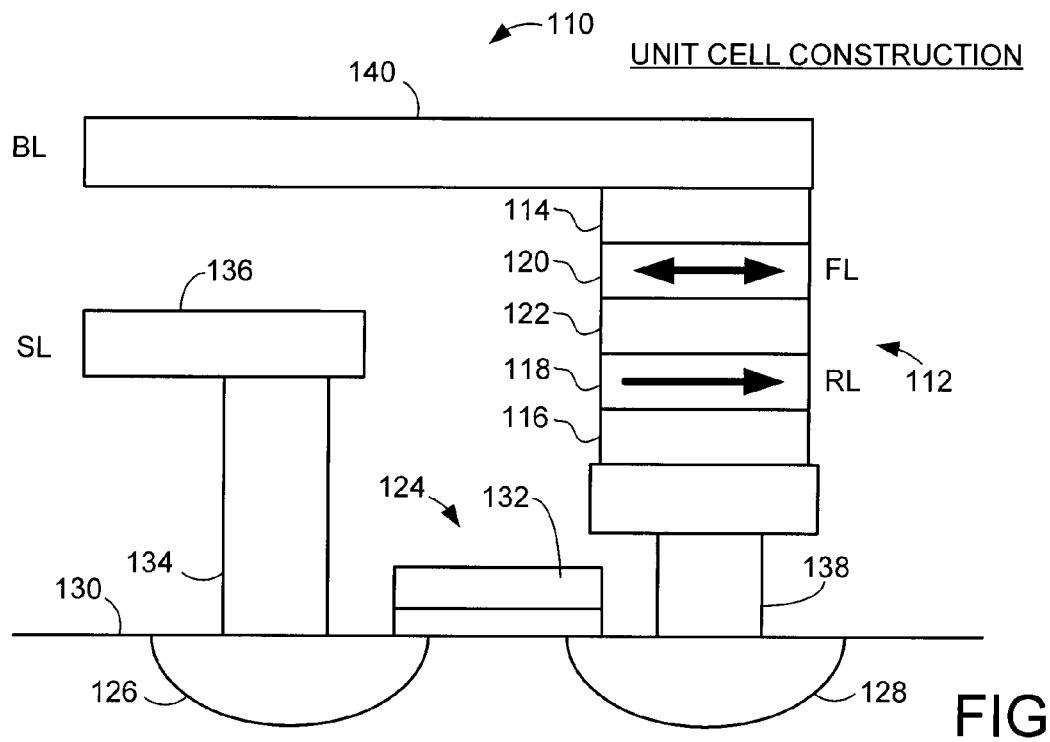
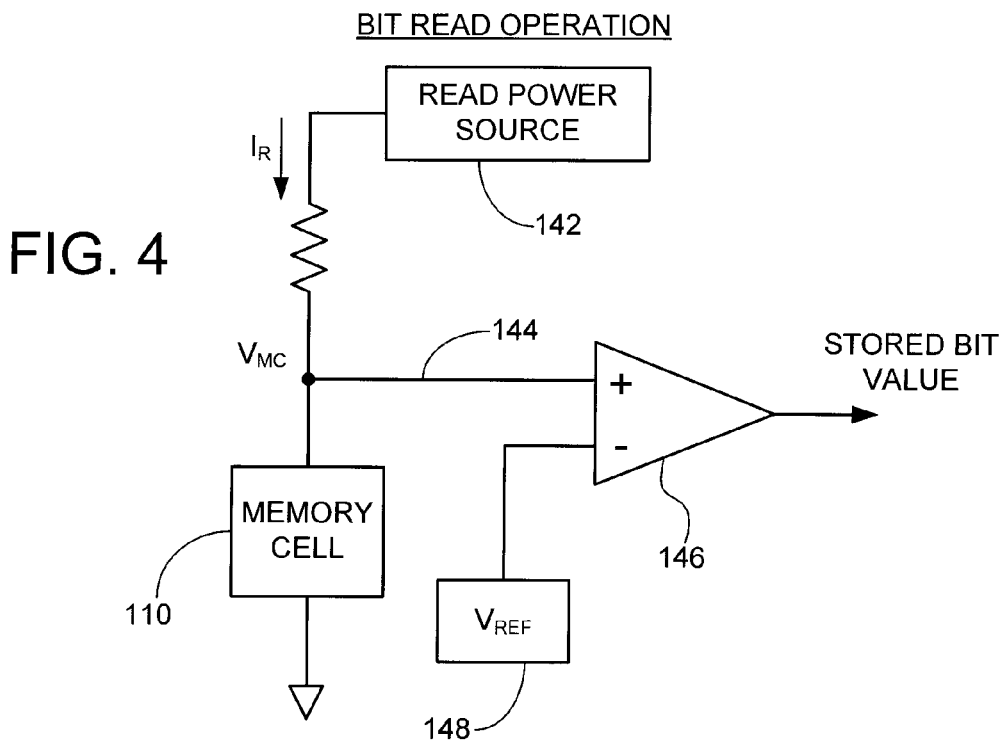

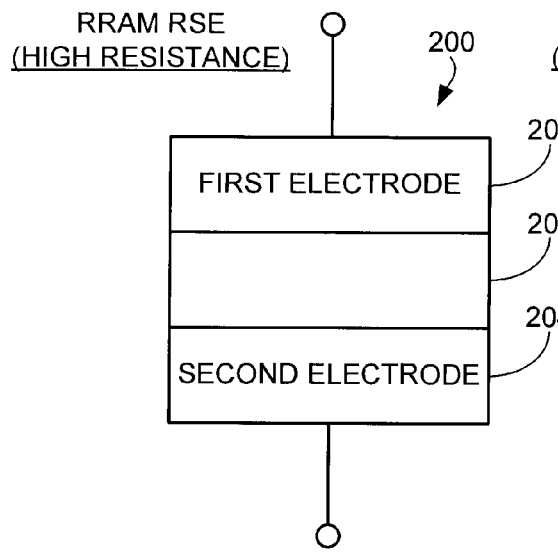
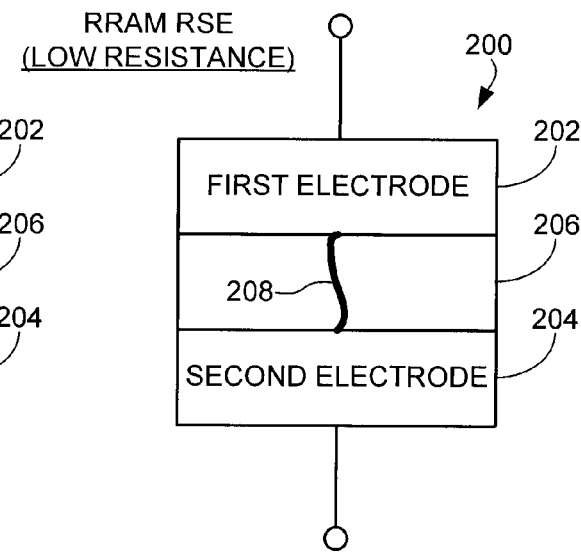
FIG. 10A
FIG. 10B
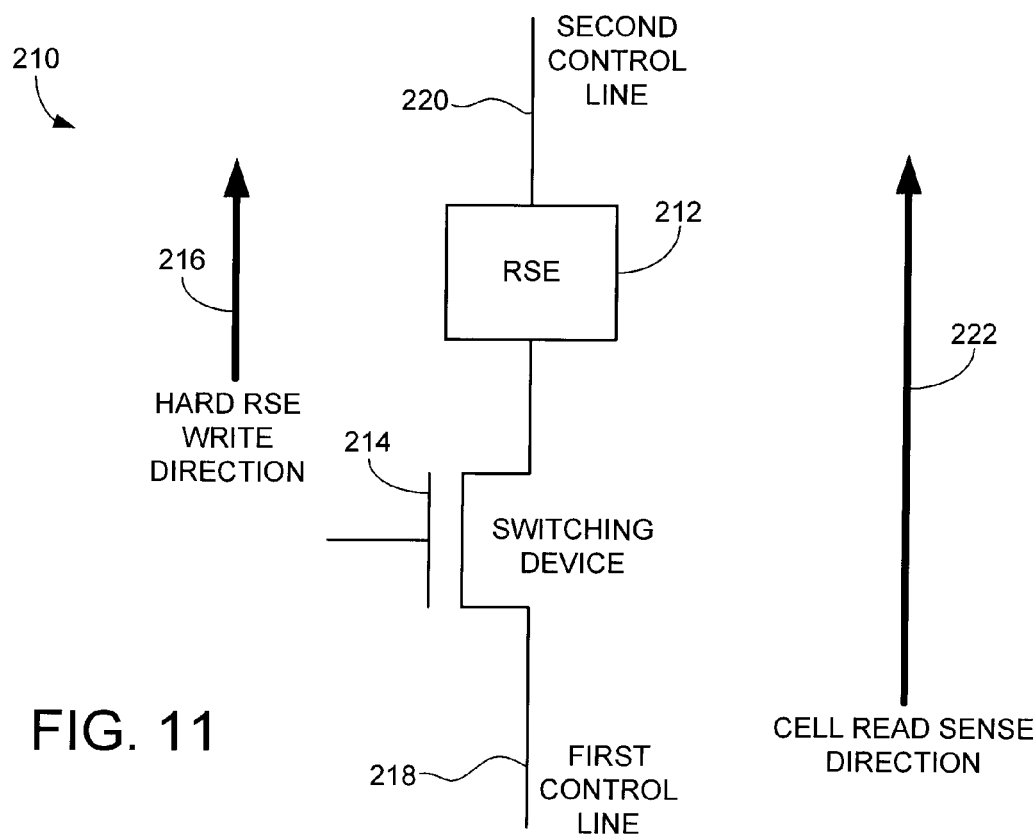
FIG. 11

ENHANCING READ AND WRITE SENSE MARGINS IN A RESISTIVE SENSE ELEMENT

RELATED APPLICATIONS

This application makes a claim of domestic priority under 35 U.S.C. §119(e) to U.S. Provisional Patent Application No. 61/103,734 filed Oct. 8, 2008.

BACKGROUND

Non-volatile memory cells can be used in a data storage array to store data. Such cells can be programmable to provide a selected readback characteristic, such as a programmed electrical resistance. The programmed characteristic can be sensed during a read operation by passing a read current through the cell.

Some types of memory cells are programmed to different states by passing write currents in different directions through the cells. For example, spin-torque transfer random access memory (STRAM) cells often utilize a magnetic tunneling junction (MTJ) element with a reference layer and a free layer separated by a barrier layer. The magnetization of the reference layer is maintained in a constant orientation, such as by being pinned to a separate magnetization layer (such as a permanent magnet). Different electrical resistances of the memory cell can be established by selectively orienting the magnetization of the free layer so as to be aligned with or opposite to the magnetization orientation of the reference layer. These different resistances can be utilized to indicate different memory states (e.g., logical 0 or 1) for the cell.

Other types of non-volatile memory cells use localized conductive paths to alter programmed resistance levels, such as in the case of resistive random access memory (RRAM). In an RRAM element, opposing electrodes can be separated by an intermediary insulative layer to provide a first nominal resistance, such as a relatively high resistance. Application of a suitable programming voltage in a first direction across the cell can result in the formation of one or more conductive metalized filaments that extend through the insulative layer from one electrode layer to the other electrode layer. The presence of such filaments can lower the nominal resistance of the cell to a second, lower level. The filament can be retracted back to the originating layer by the application of a suitable programming voltage in the opposite direction across the cell.

In these and other types of memory cell configurations, asymmetries can exist at the element level in that it can be more difficult to program a resistive sense element in a first direction as compared to a second direction. This can adversely affect data throughput rates during data reading and writing operations.

SUMMARY

Various embodiments of the present invention are generally directed to an apparatus and method for enhancing read and write margins in a memory cell having a resistive sense element (RSE), such as but not limited to a resistive random access memory (RRAM) element or a spin-torque transfer random access memory (STRAM) element.

In accordance with some embodiments, the method generally comprises programming a memory cell to a selected programmed state, the memory cell comprising a resistive sense element (RSE) having a hard programming direction and an easy programming direction; and passing a read sense current through the cell in the hard programming direction to sense the selected programmed state of the cell.

In accordance with other embodiments, the apparatus generally comprises a memory cell programmed to a selected programmed state, the memory cell comprising a resistive sense element (RSE) having a hard programming direction and an easy programming direction; and a read circuit which passes a read sense current through the cell in the hard programming direction to sense the selected programmed state of the cell.

These and other features and advantages which characterize the various embodiments of the present invention can be understood in view of the following detailed discussion and the accompanying drawings.

BRIEF DESCRIPTION OF THE DRAWINGS

FIG. 3 provides an elevational representation of an exemplary memory cell (unit cell) configuration of FIGS. 2A-2B.

FIG. 4 is a functional block representation of a read operation upon the unit cell of FIG. 4.

FIGS. 10A and 10B show an alternative memory cell construction utilizing resistive random access memory (RRAM).

FIG. 11 is a functional block diagram of an exemplary memory cell in which read sense current is passed in the hard programming direction in accordance with various embodiments.

DETAILED DESCRIPTION

Figure 1:
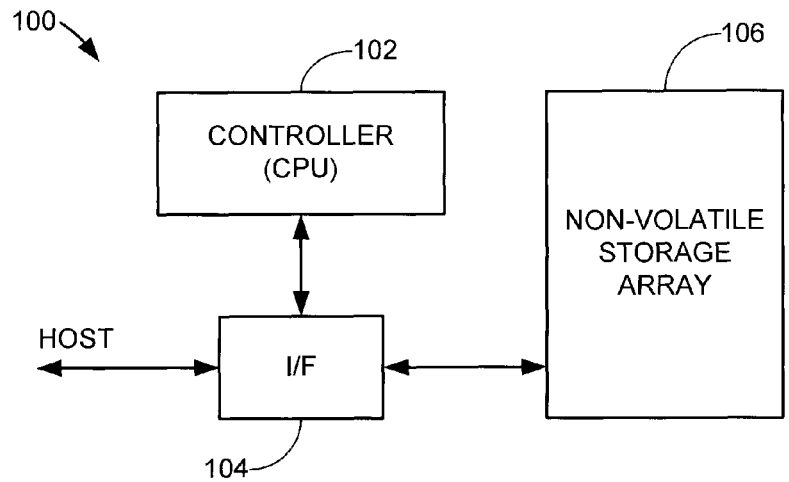
FIG. 1 provides a functional block representation of a data storage device.

FIG. 1 provides a functional block representation of a data storage device 100 to illustrate an exemplary environment in which various embodiments of the present invention can be advantageously practiced. The device 100 includes a top level controller 102, an interface (I/F) circuit 104 and a non-volatile data storage array 106. The I/F circuit 104 operates under the direction of the controller 102 to transfer user data between the array 106 and a host device (not shown). In some embodiments, the controller 102 is a programmable microcontroller, and the array 106 comprises an array of nonvolatile memory cells (unit cells).

Figure 2A:
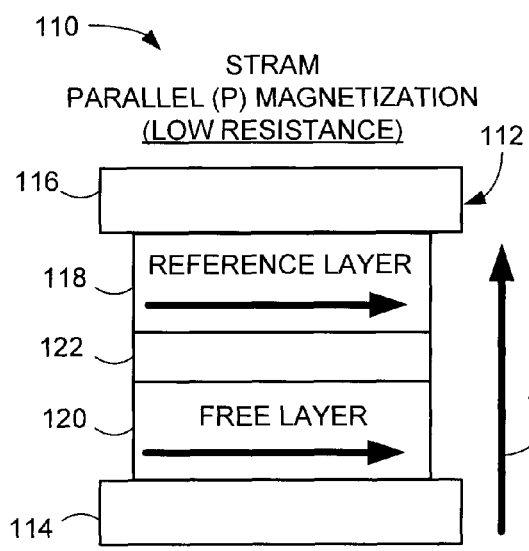
FIGS. 2A-2B respectively display an exemplary memory cell configuration for the device of FIG. 1 in accordance with a spin-torque transfer random access memory (STRAM) construction.
Figure 2B:
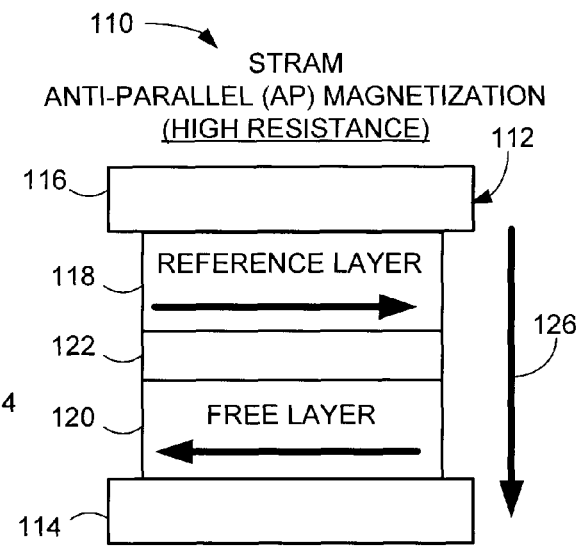

An exemplary memory cell construction is set forth at 110 in FIGS. 2A-2B. The cell 110 utilizes a spin-torque transfer random access memory (STRAM) configuration, although such is not limiting. A resistive sense element (RSE) 112 characterized as a magnetic tunneling junction (MTJ) is formed between respective electrode layers 114, 116. The MTJ 112 includes a fixed magnetic reference layer 118 and a free magnetic layer 120 separated by an intervening barrier layer 122. In some embodiments, the reference layer 118 comprises spin polarizing material that orients the spin of current passing through the MTJ 112 in a predetermined direction. The magnetization direction of the reference layer 118 may be pinned to a separate layer (not shown) that maintains the reference layer in a specified magnetic orientation. In other embodiments, the first and second electrodes 114 and 116 have spin polarizing characteristics capable of injecting spin torque-transfer switching in the MTJ 112.

The free layer 120 is formed of a suitable magnetic material arranged to have selectively different magnetization directions which are established responsive to the application of different write currents. The intervening barrier layer 122 can take any number of constructions, such as Magnesium Oxide (MgO) as shown. While the respective magnetization directions are shown to be substantially perpendicular to the direction of write current, other magnetic orientations, including in-line orientations, can be utilized as desired. Additional layers, including seed layers, shield layers, and secondary free and/or reference layers can be incorporated into the MTJ as desired.

A low resistance state for the MTJ 112 is achieved when the magnetization of the free layer 120 is oriented to be substantially in the same direction (parallel) as the magnetization of the reference layer 118. This orientation is shown in FIG. 2A. To orient the MTJ 112 in the parallel (P) low resistance state, a write current passes through the MTJ 112 so that the magnetization direction of the reference layer 118 sets the magnetic orientation of the free layer 120. Since electrons flow in the direction opposite to the direction of current, the write current direction passes from the free layer 120 to the reference layer 118, so that the electrons travel from the reference layer 118 to the free layer 120. A write current used to write the P state is represented by arrow 124.

A high resistance state for the MTJ 112 is shown in FIG. 2B and is characterized as an anti-parallel orientation in which the magnetization direction of the free layer 120 is substantially opposite that of the reference layer 118. To orient the MTJ 112 in the anti-parallel (AP) resistance state, a write current passes through the MTJ 112 in FIG. 4B so that spin-polarized electrons flow into the free layer 140. A write current used to write the AP state is represented by arrow 126.

A different logical state is assigned to each of the programmable resistances of the MTJ. In some embodiments, the low resistance, parallel (P) state of FIG. 2A is used to represent a logical 0, and the high resistance, anti-parallel (AP) state of FIG. 2B is used to represent a logical 1. Additional programmed states can be used when the MTJ is configured to store multiple bits. For example, programmed resistances R1<R2<R3<R4 can be used to respectively store multi-bit values "00," "01," "10" and "11." To subsequently read a programmed state of the unit cell 110, a read bias current can be passed through the cell and the resulting voltage drop across the cell can be compared to a suitable reference voltage.

RSEs such as the MTJ 112 in FIGS. 2A-2B can have write characteristics, in that it can be more difficult to program the RSE while flowing the write current through the RSE in a first (hard) direction to write a first state as compared to flowing the write current through the RSE in an opposing second (easy) direction to write a second state. As explained below, various embodiments disclosed herein are generally directed to selecting the direction of read current through the RSE so as to align with the hard direction for programming the RSE. This provides a number of advantages, including enhanced read and write margins.

FIG. 3 provides an exemplary construction for the unit cell 110 in accordance with some embodiments. The cell 110 includes the MTJ 112 of FIGS. 2A-2B connected in series with a switching device 124. The switching device 124 is characterized as a metal oxide semiconductor field effect transistor (MOSFET). The transistor 124 includes n-doped regions 126, 128 in a semiconductor substrate 130. A control gate 132 is coupled to a word line (WL, not shown), so that application of a suitable voltage to the WL provides a drain-source conductive path through the substrate 130 between the regions 126, 128.

A support structure 134 couples a source line, SL 136 (or source plane) to the first region 126. A second support structure 138 couples the MTJ 112 to the second region 128. A bit line, BL 140 is coupled to the MTJ opposite the second support structure 138. While the MTJ 112 is oriented such that the reference layer (RL) 118 is closer to the transistor 124 and the free layer (FL) 120 is closer to the BL 140, it will be appreciated that such is not limiting; in an alternative embodiment, this orientation is reversed such that the reference layer (RL) is closer the bit line, BL and the free layer (FL) is closer to the transistor 124. The relative orientation of the MTJ within the unit cell 110 will be taken into account in determining the direction of current flow during read operations.

FIG. 4 generally represents an exemplary read operation upon the unit cell of FIG. 3. A read current is supplied by a read power source 142, which generates a voltage drop $V_{MC}$ across the memory cell 110. The voltage drop $V_{MC}$ is supplied via path 144 as an input to a terminal of a sense amplifier 146, which compares the voltage drop to a reference voltage $V_{REF}$ from reference voltage source 148. The output level of the sense amplifier 146 indicates the programmed state of the memory cell 110. Other sensing techniques can be used.

Figure 5A:
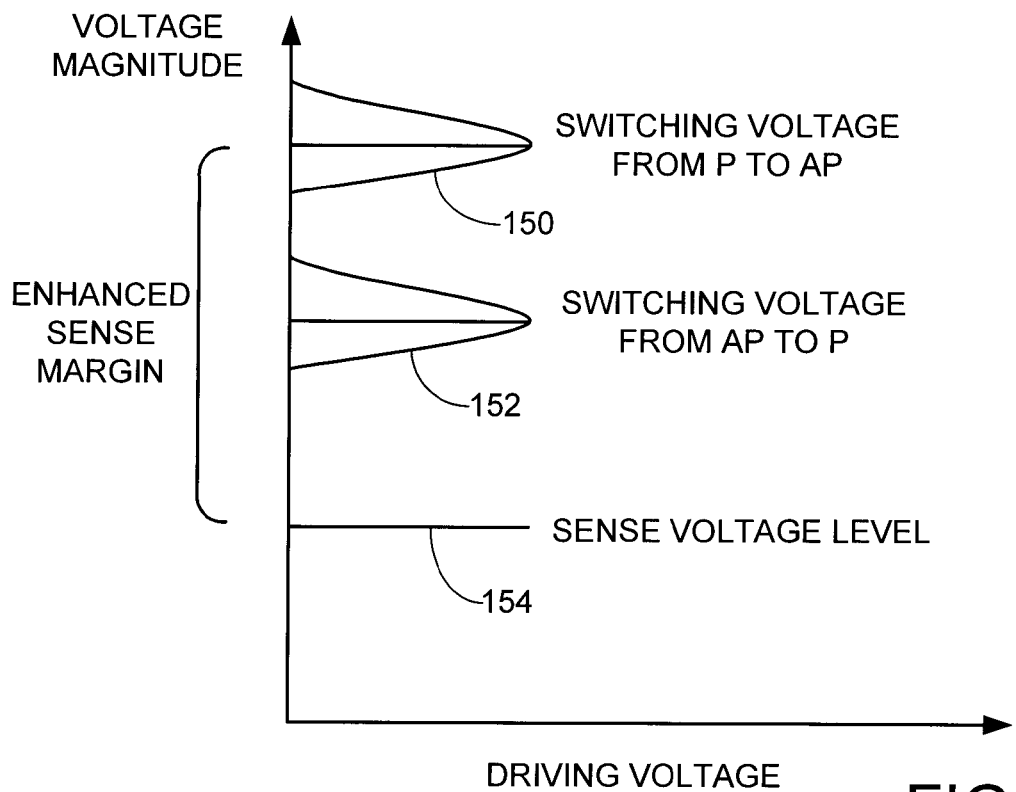
FIGS. 5A-5B respectively show voltage and current data during programming and read sensing of the exemplary unit cell.
Figure 5B:
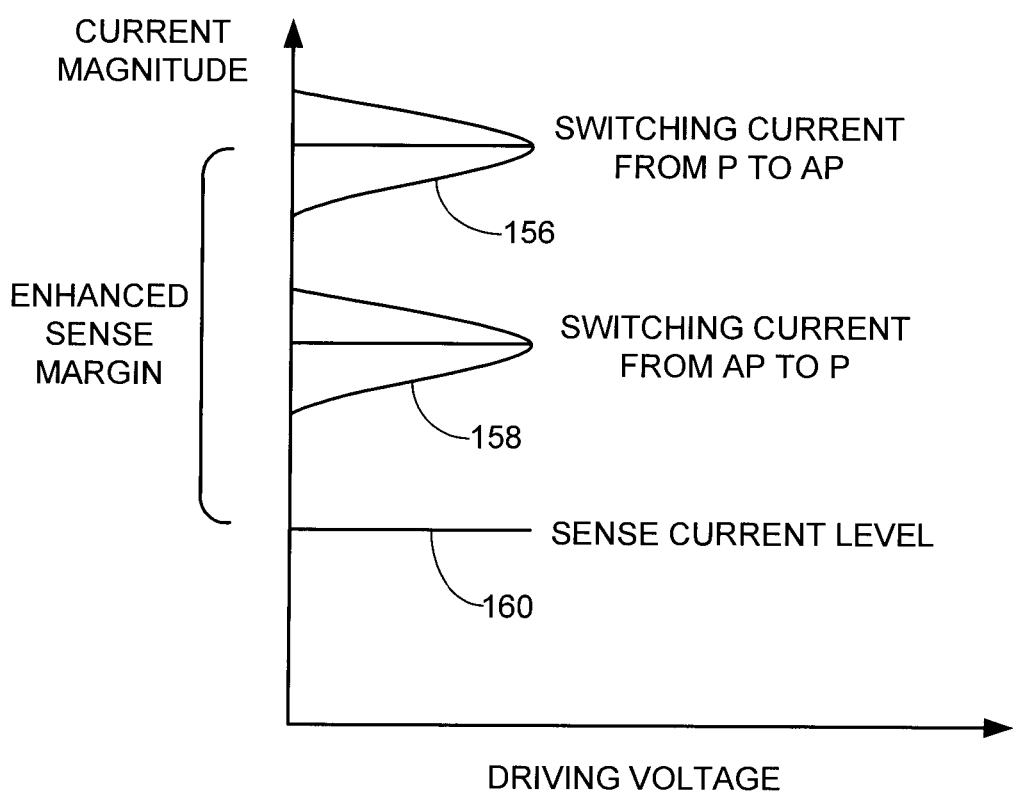

As shown in FIGS. 5A and 5B, the required amounts of voltage and current magnitude to carry out the switching of the programmed state of unit cells such as 110 can be significantly different depending on the direction of switching. For example, it is contemplated that it will be significantly easier to switch the MTJ 112 from anti-parallel to parallel (AP to P) as compared to switching the MTJ 112 from parallel to anti-parallel (P to AP).

In FIG. 5A, a first distribution of switching voltages is denoted at 150 indicative of voltage pulse magnitudes required to switch the MTJ programming state from parallel to anti-parallel (P to AP). A second distribution of switching voltages 152 indicates corresponding voltage pulse magnitudes to switch the MTJ from anti-parallel to parallel (AP to P). A voltage sense level at 154 represents a voltage level that can be used to subsequently sense the programmed state of the MTJ.

In FIG. 5B, corresponding switching current distributions are shown at 156 and 158 to switch from P to AP and from AP to P, respectively. A current sense level 160 represents a read current level that can be used to subsequently sense the programmed state of the MTJ.

Such switching asymmetries can depend upon a number of factors, including cell style and construction. Generally, for STRAM elements, the density of a write current $J_{C0}$ required to change the resistance state of the RSE 130 can be expressed as follows:

$$J_{C0} = \left(\frac{\alpha}{\eta}\right)\left(\frac{2e}{\hbar}\right)(a^2 t M_S) H_K \left[1 + \frac{2\pi M_S + H}{H_K}\right] \quad (1)$$

where the parameters $\alpha$, $\eta$, a, t, $M_s$, $H_K$, H are damping constant, spin polarization, diameter, thickness, saturation magnetization, anisotropy field of the magnetic layer and the applied field. The spin polarization $\eta$ is angle dependent and can be expressed as:

$$\eta = \left(\frac{P}{2}\right)(1 + P^2 \cos\theta) \quad (2)$$

where $\theta$ is the initial angle between free layer and reference layer and P represents the tunneling spin polarization from a reference (source) ferromagnetic layer. The value P can be found as follows:

$$P = \left(\frac{TMR}{(2+TMR)}\right)^{0.5} \quad (3)$$

If the variable $J_{C0(P-AP)}$ is used to identify the current density necessary to switch the element from parallel to anti-parallel (P-AP), and the variable $J_{C0(AP-P)}$ is used to identify the current density necessary to switch the element from anti-parallel to parallel (AP-P), then the ratio of these respective current densities can be expressed as:

$$\frac{J_{C0(P-AP)}}{J_{C0(AP-P)}} = \frac{1+P^2}{1-P^2} \quad (4)$$

It follows that the ratio of the respective write currents generally increases in relation to increases in TMR (tunneling magnetic resistance). Higher TMR is generally desirable in order to provide sufficient margin between the respective low and high resistance states (e.g., states 0 and 1). Increases in TMR, however, can have a deleterious effect of increasing the write effort necessary to write from parallel to anti-parallel (P-AP).

With regard to the corresponding voltage magnitudes required to write the respective states, set $V_{C0(P-AP)}$ to represent the voltage magnitude to effect the parallel to anti-parallel switching case. $V_{C0(AP-P)}$ correspondingly represents the voltage magnitude to effect switching from anti-parallel to parallel (AP-P). The ratio of these respective voltages can be expressed as:

$$\frac{V_{C0(P-AP)}}{V_{C0(AP-P)}} = \alpha \quad (5)$$

where $\alpha$ is the TMR at the associated $V_{C0}$ divided by the TMR at zero voltage.

Figure 6:
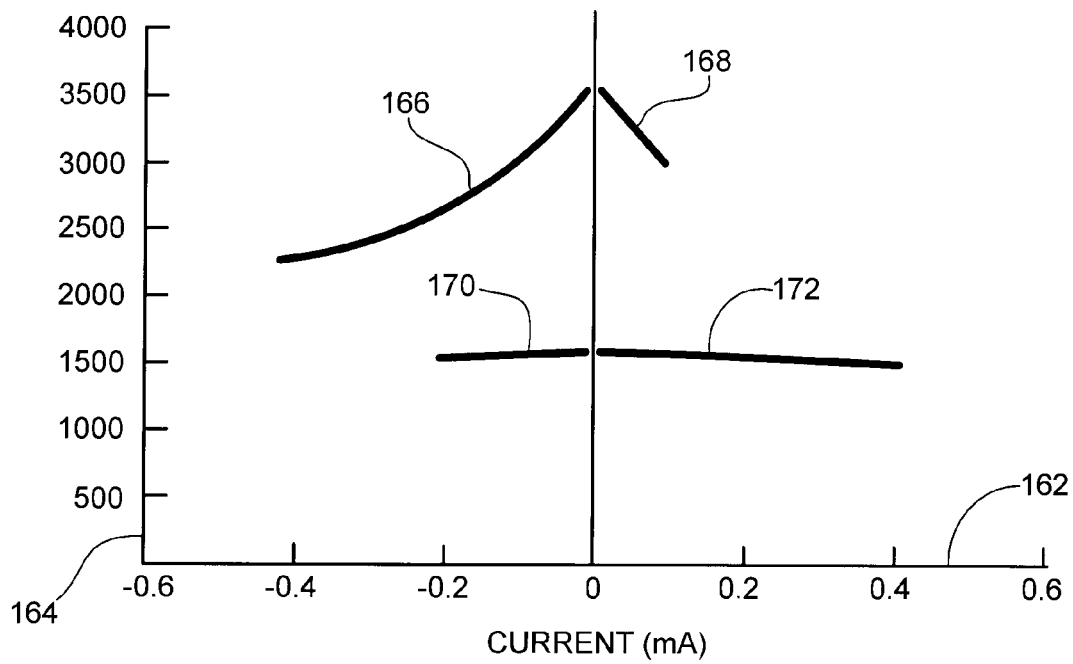
FIG. 6 depicts resistance vs. current characteristics of the exemplary unit cell.

FIG. 6 graphically illustrates MTJ resistance curves against a current magnitude x-axis 162 (in milliamps, mA) and a resistance y-axis 164 (in ohms). The respective curves are discontinuous at the x-axis location corresponding to zero current (0 mA). High resistance curve segments 166, 168 represent exemplary resistance values obtained when the MTJ 112 is programmed to the high resistance (AP) state. Low resistance curve segments 170, 172 correspondingly represent exemplary resistance values obtained when the MTJ 112 is programmed to the low resistance (P) state.

Figure 7:
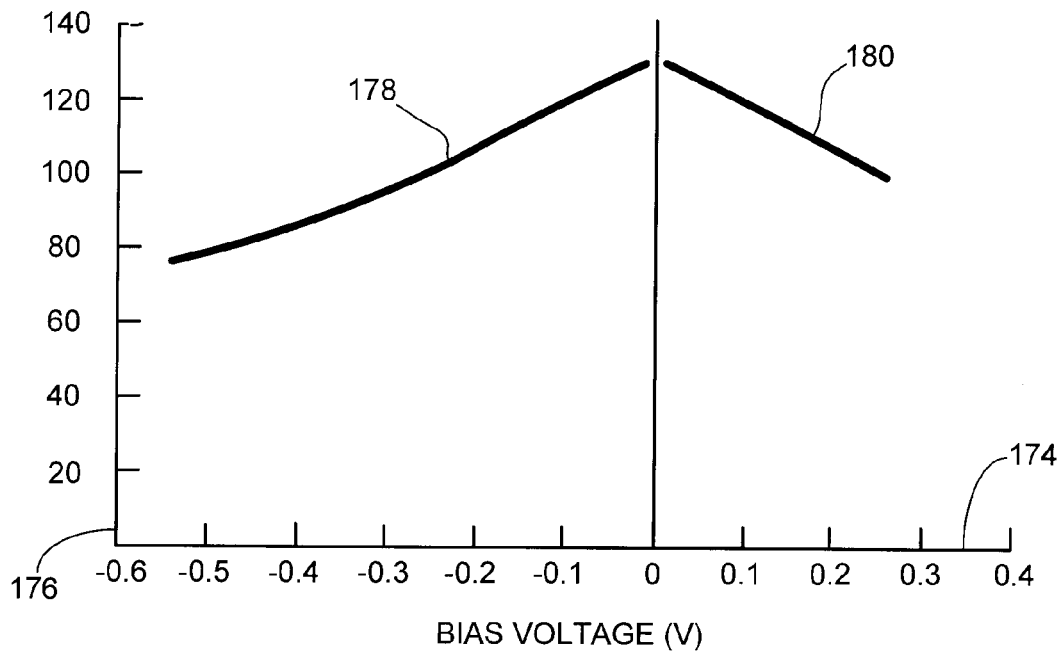
FIG. 7 depicts tunneling magnetic resistance (TMR %) v. bias voltage characteristics of the exemplary unit cell.

FIG. 7 shows resistance as a function of TMR percentage (%) vs. bias voltage. An x-axis 174 represents bias voltage magnitude (in volts, V) and a y-axis 176 represents TMR percentage from 0% to 140%. Curve segments 178, 180 are discontinuous at zero voltage (0 V).

Accordingly, as noted above the various embodiments of the present invention disclosed herein orient the direction of the sensing current during a read operation so as to be driven through an RSE in the hard direction for programming the RSE. In the case of the exemplary MTJ 112 discussed herein, the direction of flow of the read current will pass from the fixed magnetization reference layer (RL) 118 to the variable magnetization free layer (FL) 120.

This enhances read and write margins, and ensures the read current will not adversely affect the programmed state of the MTJ. Such enhanced margins are indicated in FIGS. 5A and 5B by the respective intervals between the respective sense levels 154, 160 and the harder programmed state levels 150, 156.

Figures 8A, 8B:
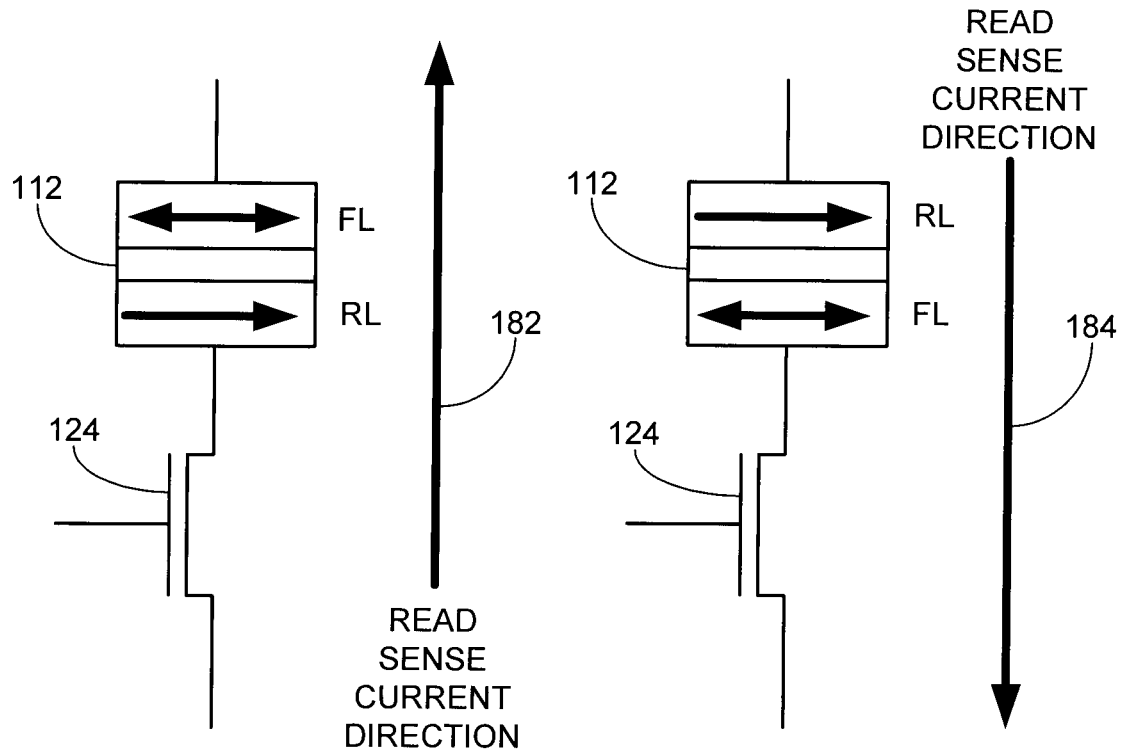
FIGS. 8A-8B generally illustrate sense current directions for different unit cell configurations in accordance with various embodiments of the present invention.

The actual direction of current through the cell 110 will depend on the relative orientation of the MTJ 112 therein. As shown in FIG. 8A, an orientation of the MTJ 112 as shown in FIG. 3 results in an applied sense current direction denoted by arrow 182, which directs the read current through the unit cell 110 from the source line SL to the bit line BL. In this orientation, the read current passes through the drain-source junction of the transistor 124 prior to passage through the MTJ 112, and the voltage drop across the cell 110 is sensed from the source line SL 136. Thus, with reference again to FIG. 4, suitable switching circuitry (not shown) connects the source line SL to the appropriate input terminal of the sense amplifier 146.

In FIG. 8B, the MTJ 112 is oriented opposite that shown in FIG. 3, resulting in an applied sense current direction as denoted by arrow 184. In this embodiment, the read current flows through the unit cell 110 from the bit line BL to the source line SL, and the bit line BL is coupled to the appropriate input terminal of the sense amplifier 146 (FIG. 4).

Figure 9:
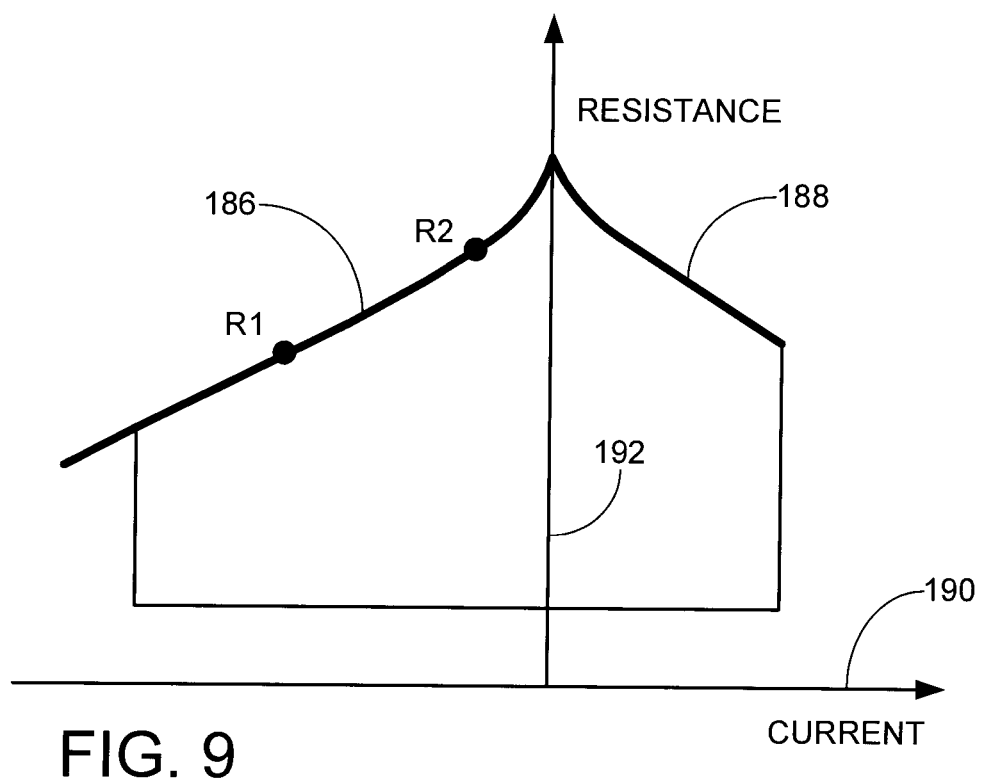
FIG. 9 shows resistance vs. current characteristics of the exemplary unit cell during a self-reference operation.

A self-sensing operation upon the cell 110 is carried out in similar fashion, so that the self-sense read current flows from the reference layer (RL) to the free layer (FL) as before. FIG. 9 shows a resistance curve with segments 186, 188 plotted against a current magnitude x-axis 190 and a resistance magnitude 192. It will be appreciated that the segments 186, 188 in FIG. 9 generally correspond to the high resistance segments 166, 168 in FIG. 6.

Two different resistances R1 and R2 are sensed for different magnitudes of read bias current. The relative change in the respective resistances can be used to determine whether the cell 110 is programmed to the high state or the low state. It will be appreciated that the direction of sense current as disclosed herein is equally suitable for voltage-based or current-based driver configurations.

This sensing scheme can be applied to other types of memory cells with RSEs, such as resistive random access memory (RRAM) cells. FIGS. 10A and 110B show an exemplary RSE 200 having an RRAM construction. Opposing metal or metal alloy electrode layers 202, 204 are separated by an intervening oxide layer 206. A first, higher resistance programmed state is denoted by FIG. 10A, and a second, lower resistance programmed state is denoted by FIG. 10B.

In FIG. 10A, the relatively higher resistance state is established by the nominal electrical resistance of the oxide layer 206. Application of a suitable write voltage potential and/or write current in a selected direction across the RSE 200 will induce metal migration from the electrode layer 202, forming one or more electrically conductive metallization filaments 208 through the oxide layer as shown in FIG. 10B.

Such filaments generally operate to lower the characteristic resistance of the cell. To return the programmed state of the RSE 200 to the high resistance state of FIG. 10A, an appropriate write voltage potential and/or current is applied through the RSE 200 in the opposite direction.

RRAM RSEs such as 200 can exhibit asymmetric write characteristics in that it can be generally more difficult to program the RSE 200 in a first direction as compared to a second direction. For example, the hard direction for programming the RSE 200 may be to the high resistance state of FIG. 10A, and the easy direction for programming the RSE 200 may be to the low resistance state of FIG. 10B. Accordingly, the direction of the sense current to subsequently read the programmed state of the RSE 200 is aligned with the hard direction. As with the MTJ 112 discussed above, such operation will enhance both read and write operations, and the read current will be less likely to adversely disturb the programmed state of the cell.

FIG. 11 shows a functional block representation of a memory cell 210 with an RSE 212 coupled to a switching device 214. The RSE can take any number of configurations including the exemplary STRAM MTJ 112 or the RRAM RSE 200. A hard direction for programming the RSE 212 is indicated by arrow 216, indicative of the direction of write current through the RSE 212 to program the RSE in the hard direction (i.e., the state that is relatively harder to program). The write current is supplied to the cell 210 from a first control line 218, which may be characterized as a source line (SL), and passes through the cell 210 to a second control line 220, which may be characterized as a bit line (BL).

A read sense direction for reading the RSE 212 is indicated by arrow 222, indicative of the direction of read current flow through the RSE 212 to subsequently sense the programmed state of the RSE. The read current is supplied from the first control line 218, through the cell 210 to the second control line 220. The voltage at the first control line 218 can be sensed by a sense amplifier, as depicted in FIG. 4.

Figure 12:
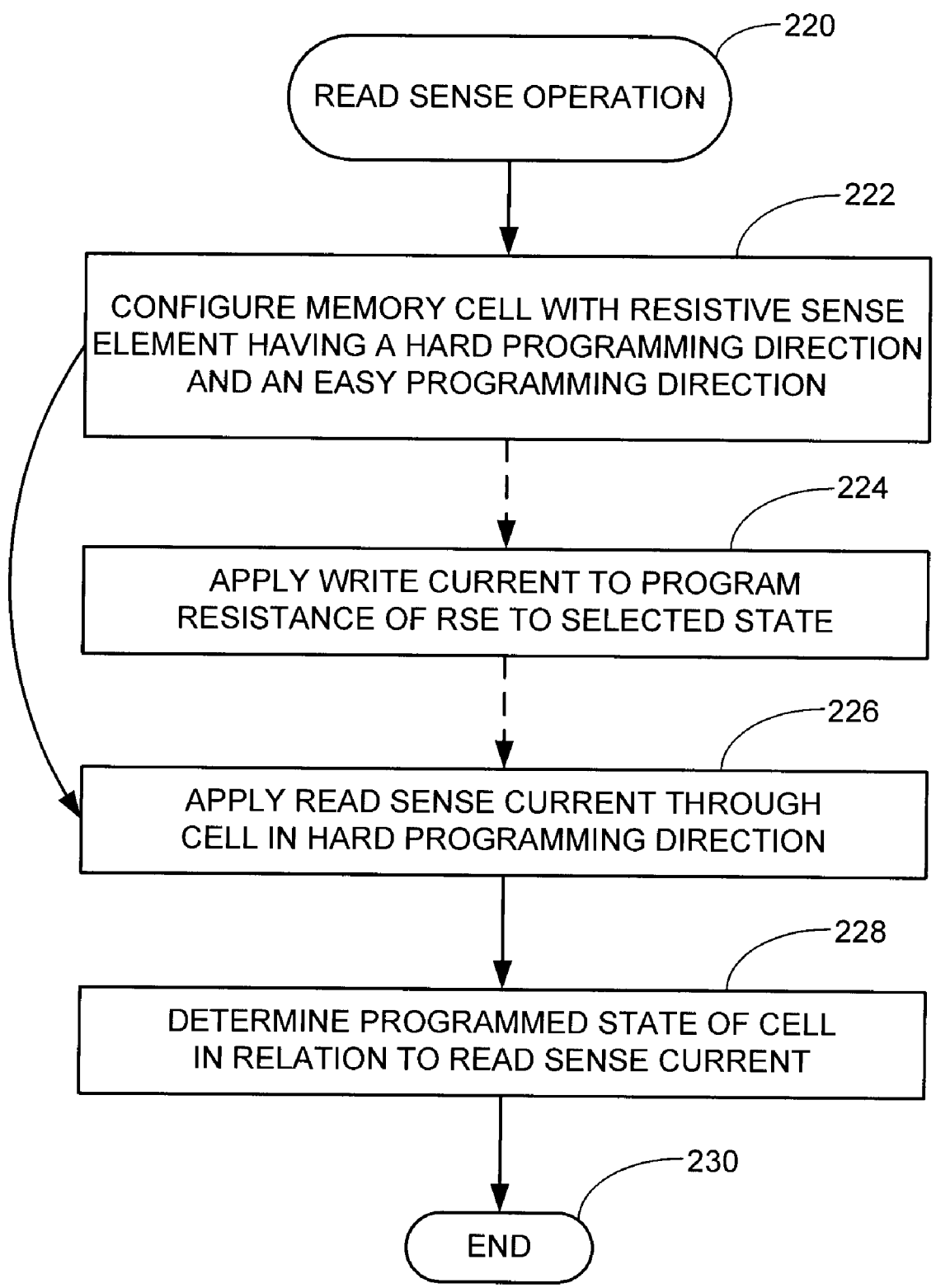
FIG. 12 is a flow chart for a READ SENSE OPERATION routine in accordance with various embodiments of the present invention.

FIG. 12 sets forth a flow chart for a READ SENSE OPERATION routine 220, generally illustrative of steps carried out in accordance with various embodiments of the present invention. A unit cell such as 210 is configured at step 222 to include an RSE with a hard programming direction and an easy programming direction.

Optionally, a suitable write current is applied to the cell 110 in step 224 to set the resistance of the cell to a desired programmed state. A read sense current is subsequently applied to the cell at step 226 so that the read current flows in the same direction as the hard programming direction. In some embodiments, routine 220 will proceed directly to step 226 without step 224. The programmed state is determined at step 228 in relation to the read sense current, such as by sensing a voltage drop across the cell induced by the read sense current. The flow ends at step 230.

The various embodiments presented herein provide certain advantages over the prior art. The direction of read sense current enhances both read and write margin by flowing in the same direction used to write the cell to the harder programming state. The read sense current direction through the cell is dependent upon the specific physical orientation of the RSE within the unit cell, and can be used with any number of different cell configurations. The various embodiments discussed herein have numerous potential applications and are not limited to a certain field of electronic media or type of data storage devices.

For purposes of the appended claims, reference to various directions of current will be understood consistent with the foregoing discussion to refer to flowing from a higher potential to a lower potential. The actual movement of electrons will be recognized to be in the opposite direction.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising:
providing a memory cell comprising a resistive sense element (RSE) having a hard programming direction and an easy programming direction; and
passing a read sense current through the cell in the hard programming direction to sense a programmed state of the cell.

2. The method of claim 1, further comprising the step of programming an asymmetric RSE of the memory cell to the programmed state.

3. The method of claim 1, wherein the hard programming direction comprises a first direction through the RSE in which a first write current is passed to set the RSE to a first resistive state, wherein the easy programming direction comprises an opposing second direction through the RSE in which a second write current is passed to set the RSE to a second resistive state, and wherein the first write current is greater in magnitude than the second write current.

4. The method of claim 1, wherein the RSE is characterized as a magnetic tunneling junction (MTJ) comprising a reference layer with a fixed direction of magnetic orientation and a free layer with a selectively adjustable direction of magnetic orientation, and wherein the read sense current passes through the MTJ in a direction from the reference layer to the free layer.

5. The method of claim 1, wherein the RSE is characterized as a resistive random access memory (RRAM) element comprising first and second electrode layers separated by an intervening layer, wherein a first write current is passed in a first direction through the RSE to form a conductive filament through the intervening layer from the first electrode layer to the second electrode layer to place the RSE in a first programmed state, wherein a second write current is passed in a second direction through the RSE opposite the first direction to remove the conductive filament from the intervening layer to place the RSE in a second programmed state, wherein the second write current is greater in magnitude than the first write current and corresponds to the hard programming direction.

6. The method of claim 1, wherein the memory cell further comprises a switching device connected in series with the RSE.

7. The method of claim 6, wherein the RSE is physically oriented within the memory cell with respect to the switching device such that the read sense current passes through the switching device prior to passing through the RSE.

8. The method of claim 6, wherein the RSE is physically oriented within the memory cell with respect to the switching device such that the read sense current passes through the RSE prior to passing through the switching device.

9. The method of claim 1, wherein the read sense current of the passing step establishes a read voltage drop across the cell, and wherein the method further comprises comparing the read voltage drop to a reference voltage to sense the programmed state of the cell.

10. The method of claim 1, wherein the passing step comprises carrying out a self-reference operation step by successively passing first and second read sense currents through the cell in the hard programming direction, and sensing the programmed state of the cell in relation to changes in magnitude of voltages associated with the first and second read sense currents.

11. An apparatus comprising:
a memory cell programmed to a selected programmed state, the memory cell comprising a resistive sense element (RSE) having a hard programming direction and an easy programming direction; and
a read circuit which passes a read sense current through the cell in the hard programming direction to sense the selected programmed state of the cell.

12. The apparatus of claim 11, wherein read sense current establishes a read voltage drop across the cell, and wherein the read circuit further compares the read voltage drop to a reference voltage to sense the programmed state of the cell.

13. The apparatus of claim 11, wherein the hard programming direction comprises a first direction through the RSE in which a first write current is passed to set the RSE to a first resistive state, wherein the easy programming direction comprises an opposing second direction through the RSE in which a second write current is passed to set the RSE to a second resistive state, and wherein the first write current is greater in magnitude than the second write current.

14. The apparatus of claim 11, wherein the RSE is characterized as a magnetic tunneling junction (MTJ) comprising a reference layer with a fixed direction of magnetic orientation and a free layer with a selectively adjustable direction of magnetic orientation, and wherein the read sense current passes through the MTJ in a direction from the reference layer to the free layer.

15. The apparatus of claim 11, wherein the RSE is characterized as a resistive random access memory (RRAM) element comprising first and second electrode layers separated by an intervening layer, wherein a first write current is passed in a first direction through the RSE to form a conductive filament through the intervening layer from the first electrode layer to the second electrode layer to place the RSE in a first programmed state, wherein a second write current is passed in a second direction through the RSE opposite the first direction to remove the conductive filament from the intervening layer to place the RSE in a second programmed state, wherein the second write current is greater in magnitude than the first write current and corresponds to the hard programming direction.

16. The apparatus of claim 11, wherein the memory cell further comprises a switching device connected in series with the RSE.

17. The apparatus of claim 16, wherein the RSE is physically oriented within the memory cell with respect to the switching device such that the read sense current passes through the switching device prior to passing through the RSE.

18. The apparatus of claim 16, wherein the RSE is physically oriented within the memory cell with respect to the switching device such that the read sense current passes through the RSE prior to passing through the switching device.

19. The apparatus of claim 17, wherein the read sense current passes from a source line to a bit line through the RSE and switching device.

20. The apparatus of claim 11, wherein the read circuit carries out a self-reference operation by successively passing first and second read sense currents through the cell in the hard programming direction, and sensing the programmed state of the cell in relation to changes in magnitude of voltages associated with the first and second read sense currents.

* * * * *